(12) United States Patent
Tang et al.

(10) Patent No.: US 9,748,354 B2
(45) Date of Patent: Aug. 29, 2017

(54) MULTI-THRESHOLD VOLTAGE STRUCTURES WITH A LANTHANUM NITRIDE FILM AND METHODS OF FORMATION THEREOF

(71) Applicant: APPLIED MATERIALS, INC., Santa Clara, CA (US)

(72) Inventors: Wei V. Tang, Santa Clara, CA (US); Paul F. Ma, Santa Clara, CA (US); Steven C. H. Hung, Sunnyvale, CA (US); Michael Chudzik, Mountain View, CA (US); Siddarth Krishnan, Newark, CA (US); Wenyu Zhang, Sunnyvale, CA (US); Seshadri Ganguli, Sunnyvale, CA (US); Naomi Yoshida, Sunnyvale, CA (US); Lin Dong, San Jose, CA (US); Yixiong Yang, San Jose, CA (US); Liqi Wu, Santa Clara, CA (US); Shih Chung Chen, Cupertino, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 15/043,883

(22) Filed: Feb. 15, 2016

(65) Prior Publication Data
US 2017/0179252 A1    Jun. 22, 2017

Related U.S. Application Data

(60) Provisional application No. 62/268,997, filed on Dec. 17, 2015.

(51) Int. Cl.
*H01L 29/76*    (2006.01)
*H01L 29/66*    (2006.01)
(Continued)

(52) U.S. Cl.
CPC .... *H01L 29/66446* (2013.01); *H01L 21/0254* (2013.01); *H01L 21/0262* (2013.01);
(Continued)

(58) Field of Classification Search
CPC . H01L 29/518; H01L 29/517; H01L 29/4966; H01L 21/0262
(Continued)

(56) References Cited

U.S. PATENT DOCUMENTS 7,821,081 B2    10/2010    Guha et al.
8,129,280 B2    3/2012    Wang et al.
(Continued)

OTHER PUBLICATIONS

Examination of flatband and threshold voltage tunin of HfO2/TiN field effect transistors by dielectric cap layers. S. Guha, V.K. Paruchuri, M. Copel, V. Narayanan, Y. Y. Wang, P. E. Batson, N. A. Bojarczuk, B. Linder, and B. Doris. Applied Physics Letters 90, 092902-1-3 (2007)

*Primary Examiner* — Theresa T Doan
(74) *Attorney, Agent, or Firm* — Moser Taboada; Alan Taboada

(57) ABSTRACT

Semiconductor devices incorporating multi-threshold voltage structures and methods of forming such semiconductor devices are provided herein. In some embodiments of the present disclosure, a semiconductor device having a multi-threshold voltage structure includes: a substrate; a gate dielectric layer atop the substrate, wherein the gate dielectric layer comprises an interface layer and a high-k dielectric layer atop the interface layer; a lanthanum nitride layer deposited atop the high-k dielectric layer; an interface of the interface layer and the high-k dielectric layer comprising lanthanum species from the lanthanum nitride layer; and a gate electrode layer atop the lanthanum nitride layer.

20 Claims, 6 Drawing Sheets

(51) Int. Cl.
  *H01L 29/786* (2006.01)
  *H01L 21/02* (2006.01)
  *H01L 29/51* (2006.01)
  *H01L 29/49* (2006.01)

(52) U.S. Cl.
  CPC ........ *H01L 29/4966* (2013.01); *H01L 29/517* (2013.01); *H01L 29/78603* (2013.01); *H01L 29/78681* (2013.01)

(58) Field of Classification Search
  USPC ....................................................... 257/314
  See application file for complete search history.

(56) References Cited

U.S. PATENT DOCUMENTS

| | | |
|---|---|---|
| 8,343,837 B2 | 1/2013 | Carter et al. |
| 8,802,522 B2 | 8/2014 | Ward et al. |
| 2016/0035856 A1* | 2/2016 | van Bentum ..... H01L 21/28158 257/295 |

* cited by examiner

_US 9,748,354 B2_

MULTI-THRESHOLD VOLTAGE STRUCTURES WITH A LANTHANUM NITRIDE FILM AND METHODS OF FORMATION THEREOF

CROSS-REFERENCE TO RELATED APPLICATIONS

This application claims benefit of U.S. provisional patent application Ser. No. 62/268,997, filed Dec. 17, 2015, which is herein incorporated by reference in its entirety.

FIELD

Embodiments of the present disclosure generally relate to improved semiconductor devices incorporating multi-threshold voltage structures and improved methods of forming such semiconductor devices.

BACKGROUND

The migration of transistor technology from planar to FINFET utilizes conformal work function layers suitable for multiple threshold voltages (Vt). The threshold voltages (Vt) tuning range is limited by the thickness variation with further scaling down of device sizes. The inventors have discovered that a dipole layer can serve to shift the work function in both PMOS and NMOS type transistors.

Accordingly, the inventors have developed improved semiconductor devices incorporating multi-threshold voltage structures and improved methods of forming such semiconductor devices.

SUMMARY

Semiconductor devices incorporating multi-threshold voltage structures and methods of forming such semiconductor devices are provided herein. In some embodiments of the present disclosure, a semiconductor device having a multi-threshold voltage structure includes: a substrate; a gate dielectric layer atop the substrate, wherein the gate dielectric layer comprises an interface layer and a high-k dielectric layer atop the interface layer; a lanthanum nitride layer deposited atop the high-k dielectric layer; an interface of the interface layer and the high-k dielectric layer comprising lanthanum species from the lanthanum nitride layer; and a gate electrode layer atop the lanthanum nitride layer.

In some embodiments, a method of forming a semiconductor device having a multi-threshold voltage structure may include: depositing a lanthanum nitride layer atop a substrate comprising a gate dielectric layer, wherein the gate dielectric layer comprises an interface layer and a high-k dielectric layer atop the interface layer; depositing a gate electrode atop the lanthanum nitride layer; depositing a capping layer atop the gate electrode; and annealing the substrate to a temperature of about 700 to about 950 degrees Celsius to diffuse lanthanum species from the lanthanum nitride layer to an interface of the interface layer and the high-k dielectric layer.

In some embodiments, a computer readable medium is provided having instructions stored thereon that, when executed; cause a method of forming a device on a substrate. The method may include any of the embodiments disclosed herein Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. The appended drawings illustrate only typical embodiments of the disclosure and are therefore not to be considered limiting of the scope, for the disclosure may admit to other equally effective embodiments.

Figure 1:
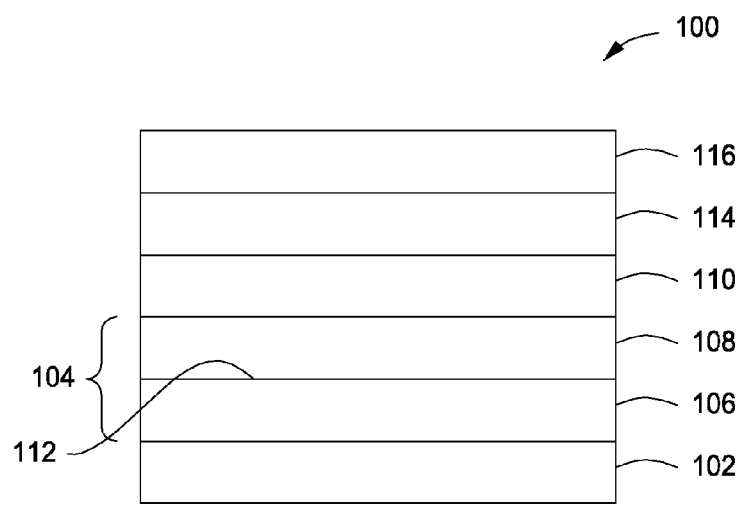
FIG. 1 depicts a partial schematic view of a semiconductor device having a multi-threshold voltage structure in accordance with some embodiments of the present disclosure

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Semiconductor devices having a multi-threshold voltage structure and methods for forming such semiconductor devices are disclosed herein.

Embodiments of the disclosure may advantageously utilize lanthanum nitride as a dipole layer in a semiconductor device to improve diffusion effects, lower the thermal budget, and provide a work function layer closer to a predetermined band edge value than conventional n-metal material.

Embodiments of the disclosure may also advantageously eliminate air exposure between formation of the dipole layer and a subsequent capping layer to avoid formation of an oxide layer. The dipole layer and the subsequent capping layer can be formed by in-situ deposition or inside the same hardware.

FIG. 1 depicts a partial schematic view of a semiconductor device having a multi-threshold voltage structure 100 in accordance with some embodiments of the present disclosure. The semiconductor device can be a transistor. The transistor (when completed) may be, for example, a field effect transistor (FET), a fin field effect transistor (FinFET), a flash memory device, a 3D FINFET device, or the like.

The multi-threshold voltage structure 100 may be completely or partially formed upon a substrate 102. In some embodiments, the substrate 102 may have various dimensions, such as 200 or 300 mm diameter wafers, as well as rectangular or square panels. In some embodiments, the substrate 102 may be any substrate suitable for forming a FinFET device. In some embodiments, the substrate 102 may comprise a material such as crystalline silicon (e.g., Si<100>, Si<110> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like.

A gate dielectric layer 104 is deposited atop the substrate 102. The gate dielectric layer comprises an interface layer 106 and a high-k dielectric layer 108 formed atop the interface layer 106. In some embodiments, the interface layer 106 may include silicon dioxide ($SiO_2$), silicon oxynitride (SiON) or the like. In some embodiments, the high-k dielectric layer 108 comprises a material having a high dielectric constant such as silicon oxide ($SiO_2$), hafnium oxide ($HfO_2$), zirconium oxide ($ZrO_2$), hafnium silicate (HfSiO), or aluminum oxide ($Al_2O_3$).

A dipole layer 110 is deposited atop the high-k dielectric layer 108. The dipole layer 110 is typically a layer of material provided between the gate dielectric layer 104 and the work function metal, such as the gate electrode, which alters the transistor threshold voltage. The dipole layer 110 is a lanthanum nitride layer deposited atop the high-k dielectric layer 108. In some embodiments, the lanthanum nitride layer has a suitable thickness to modulate the threshold voltage of the transistor to a predetermined value, for example a thickness of about 1 to about 6 angstroms, for example a thickness of about 3 angstroms. In some embodiments, the lanthanum nitride layer comprises for example about 10 to about 50 atomic percent nitrogen, for example about 30 atomic percent nitrogen, with the balance being lanthanum, or consisting essentially of lanthanum.

As explained below, annealing the substrate 102 causes lanthanum species from the dipole layer 110 to diffuse to the interface 112 of the interface layer 106 and the high-k dielectric layer 108. In some embodiments, the substrate 102 is annealed at a temperature of about 700 to about 950 degrees Celsius to allow the lanthanum species from the dipole layer 110 to diffuse to the interface 112 of the interface layer 106 and the high-k dielectric layer 108. As the lanthanum species diffuses to the interface 112, the threshold voltage of the transistor is reduced. While lanthanum oxide is commonly used in the semiconductor industry as a dipole material, the inventors have observed that a lanthanum nitride layer advantageously improves diffusion effects, lowers the thermal budget, and provides a work function layer closer to a predetermined band edge value than conventional n-metal materials.

A gate electrode 114 is formed atop the dipole layer 110. The gate electrode 114 may comprise any suitable metal, metal alloy or metal-containing material that is capable of functioning with the transistor to produce an effective work function and/or threshold voltage for the device. Exemplary metals, metal alloys or metal-containing materials that may comprise the gate electrode 114 may include one or more of titanium nitride (TiN), tantalum nitride (TaN), tungsten (W), or aluminum (Al).

In some embodiments, a capping layer 116 is formed atop the gate electrode 114 to protect the gate electrode 114 from subsequent processing. In some embodiments, the capping layer 116 is polysilicon.

Figure 2:
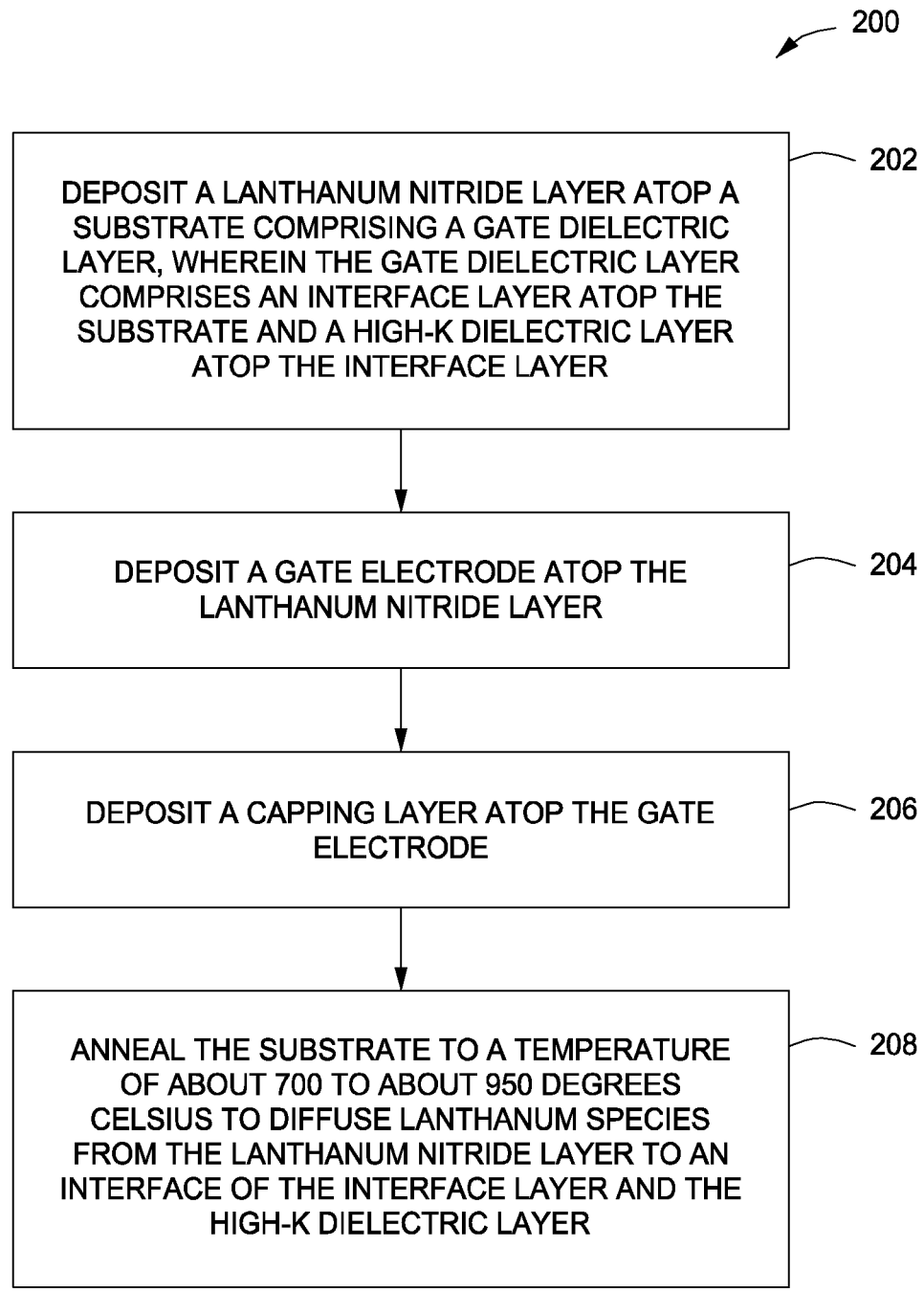
FIG. 2 depicts a flow chart for a method of forming a semiconductor device having a multi-threshold voltage structure in accordance with some embodiments of the present disclosure.

FIG. 2 depicts a method 200 for forming a semiconductor device 300 incorporating multi-threshold voltage structures in accordance with some embodiments of the present disclosure. The method is described below in accordance with the stages of fabrication of a semiconductor device 300 depicted in FIGS. 3A-3F. The inventive method 200 may be part of a multi-step fabrication process of, for example, a semiconductor device as depicted in FIG. 5. Accordingly, the method 200 may be performed, for example, in a suitable integrated tool, such as is described below with respect to FIG. 4. For example, the integrated tool may include additional process chambers for fabricating a semiconductor device, such as chambers configured for plasma etching, plasma deposition, physical vapor deposition (PVD), chemical vapor deposition (CVD), oxidation, or any suitable chamber necessary for the fabrication of a semiconductor device. Exemplary processing systems that may be used to perform the inventive methods disclosed herein may include, but are not limited to, any of the ENDURA®, CENTURA®, or PRODUCER® line of processing systems, commercially available from Applied Materials, Inc., of Santa Clara, Calif. Other process chambers, including ones available from other manufacturers, may also be suitably used in connection with the teachings provided herein.

The method 200 is performed on a substrate 102. The substrate 102 may have various dimensions, such as 200 or 300 mm diameter wafers, as well as rectangular or square panels. The substrate 102 may comprise a material such as crystalline silicon (e.g., Si<100>, Si<110> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like.

Figure 3A:
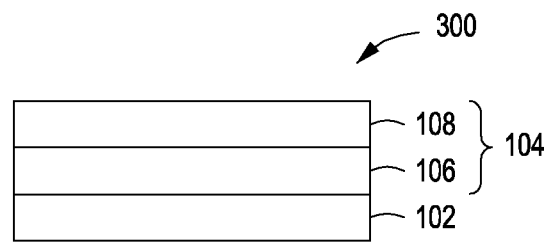
FIGS. 3A-F depict the stages of fabrication of a semiconductor device having a multi-threshold voltage structure in accordance with some embodiments of the present disclosure.

As illustrated in FIG. 3A, the substrate 102 may include a gate dielectric layer 104 as described above. The gate dielectric layer 104 comprises an interface layer 106 and a high-k dielectric layer 108 formed atop the interface layer 106. In some embodiments, the interface layer 106 may include silicon dioxide ($SiO_2$), silicon oxynitride (SiON) or the like. In some embodiments, the high-k dielectric layer 108 comprises a material having a high dielectric constant. In some embodiments, the high-k dielectric layer may comprise a dielectric material having a dielectric constant that is greater than about 4. In some embodiments, the high-k dielectric layer 108 comprises a material such as silicon oxide ($SiO_2$), hafnium oxide ($HfO_2$), zirconium oxide ($ZrO_2$), hafnium silicate (HfSiO), or aluminum oxide ($Al_2O_3$).

Figure 3B:
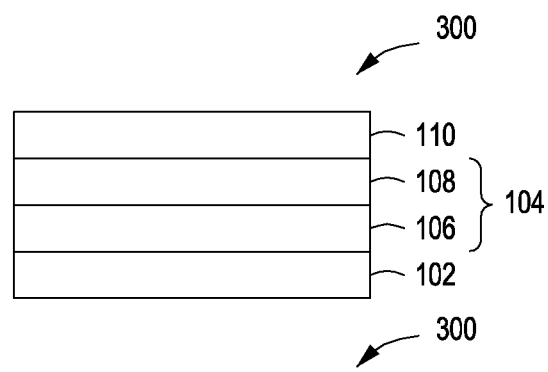

The method 200 begins at 202, and as depicted in FIG. 3B, by depositing a dipole layer 110 atop the substrate 102. The dipole layer 110 is lanthanum nitride. The dipole layer 110 is a layer of material provided between the gate dielectric layer 104 and the work function metal, such as the gate electrode, which alters the transistor threshold voltage. In some embodiments, the lanthanum nitride material is deposited by any suitable vapor deposition process, such as a chemical vapor deposition process or an atomic layer deposition process. In some embodiments, the lanthanum nitride layer is deposited via an atomic layer deposition process by cyclically exposing the substrate to a suitable lanthanum containing precursor, such as lanthanum formamidinate or lanthanum cyclopentadienyl, and a nitrogen containing gas such as ammonia ($NH_3$) and hydrazine ($N_2H_4$) at a suitable substrate temperature, such as about 250 to about 350 degrees Celsius, for deposition to occur.

Figure 3C:
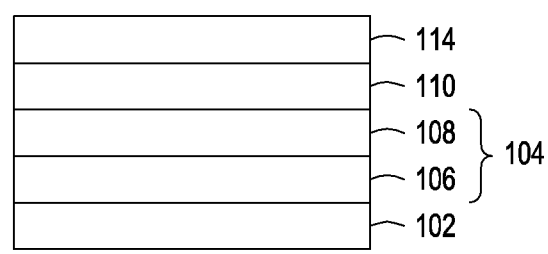

Next, at 204 and as depicted in FIG. 3C, a gate electrode 114 is deposited atop the dipole layer 110. The gate electrode 114 may comprise any suitable metal, metal alloy or metal-containing material capable of functioning with the transistor to produce an effective work function and/or threshold voltage for the device. In some embodiments, the gate electrode 114 may be deposited using any suitable deposition process, such as physical vapor deposition or chemical vapor deposition.

Figure 3D:
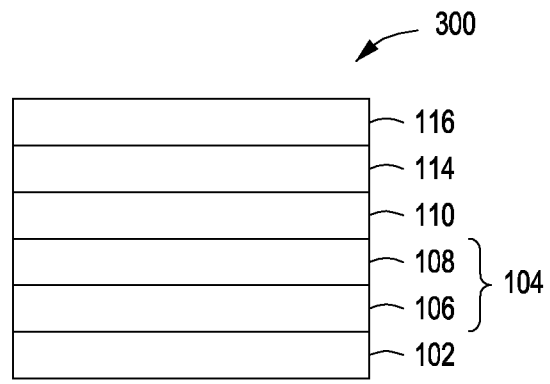

Next, at 206 and as depicted in FIG. 3D, a capping layer 116 is depositing atop the gate electrode 114. In some embodiments, the capping layer 116 is polysilicon. The capping layer 116 may be formed to any suitable thickness to protect the gate electrode 114 from subsequent processing.

Figure 3E:
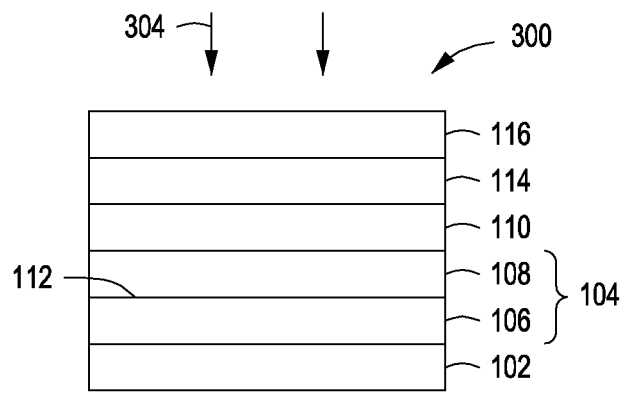

Next, at 208 and as depicted in FIG. 3E, the substrate is annealed 304 to a temperature of about 700 to about 950 degrees Celsius to diffuse lanthanum species from the dipole layer 110 to an interface 112 of the interface layer 106 and the high-k dielectric layer 108.

Figure 3F:
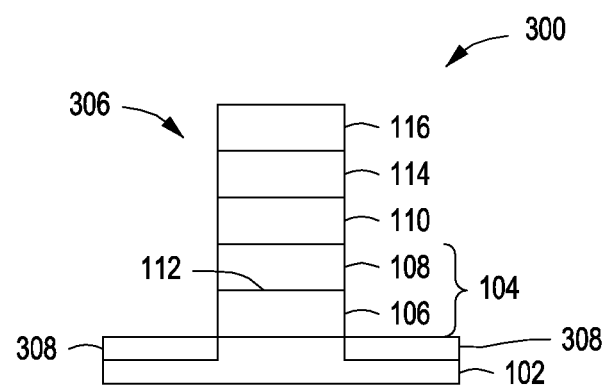

Following the method 200, the semiconductor device 300 may undergo additional processes to complete formation of the semiconductor device 300. For example, as depicted in FIG. 3F, the semiconductor device 300 may undergo a patterning process to form a film stack 306 atop the substrate 102 and processes for forming sources/drains 308 may be performed.

In some embodiments, the semiconductor device 300 may be an n-type metal oxide semiconductor (NMOS) device or p-type metal oxide semiconductor (PMOS) device. In some embodiments, the semiconductor device 300 may be a complementary metal-oxide-semiconductor (CMOS) device having an n-type metal oxide semiconductor (NMOS) device and a p-type metal oxide semiconductor (PMOS) device separated by an isolation region. For example, FIG. 5 depicts an exemplary semiconductor device 500 configured as an NMOS transistor in accordance with embodiments of the present disclosure. However, the transistor may be a PMOS transistor, as well as any suitable semiconductor device. Although described below in connection with particular details, other embodiments and variations may also be used in accordance with the teachings disclosed herein.

The semiconductor device 500 includes a substrate 502 having a film stack 306, as described above, disposed on the substrate 502. The substrate 502 may be substantially similar in composition to the substrate 102 as discussed above. The substrate 502 may include other structures or layers at least partially formed on the substrate 502. For example, the substrate 502 may include a p-type region 504 defined in the substrate 502 and having the film stack 306 partially fabricated atop the p-type region 504. In some embodiments, such as where one or more transistors are being formed on the substrate 502, a plurality of field isolation regions 503 may be formed in the substrate 502 to isolate wells having different conductivity types (e.g., n-type or p-type) and/or to isolate adjacent transistors. The field isolation regions 503 may be shallow trench isolation (STI) structures formed, for example, by etching a trench into the substrate 502 and then filling the trench with a suitable insulator, such as silicon oxide (oxide), silicon nitride (nitride), or the like. The field isolation regions 503 include a first surface 505. The first surface 505 may include at least one of an amorphous or polycrystalline surface.

The p-type region 504 may be formed by one or more implant processes using a suitable dopant, such as boron, or indium into the substrate 502. The p-type region 504 may also be formed by other means including providing an initially doped substrate, or depositing an in situ doped semiconductor material with a predetermined conductivity. The p-type region 504 may have a doping density, for example, of between about $5 \times 10^{16}$ atoms/cm$^3$ and about $5 \times 10^{19}$ atoms/cm$^3$. The p-type region 504 of the substrate 502 may be etched by any suitable etch process to form etched regions disposed on opposite sides of the film stack 306 and defining a channel 516 of the transistor between the etched regions.

The substrate 502 may further be exposed to a repeating iterative sequence of deposition and etching gases to form source/drain regions 526 of the semiconductor device 500. In some embodiments, the source/drain regions 526 may be n-doped silicon carbon (SiC). In some embodiments, the n-dopant may further include phosphorus (P).

The film stack 306 may further comprise sidewall spacers 510, which may be formed along the outer sidewalls of the film stack 306. The sidewall spacers 510 may be formed, for example, to a thickness between about 5 nm and about 30 nm, or any other thickness suitable to electrically isolate the film stack 306 from subsequently deposited material. The sidewall spacers 510 may comprise suitable insulating materials, for example, silicon nitride, silicon oxide, silicon oxynitride, silicon carbide, or the like. The sidewall spacers 510 may be deposited by any suitable process, such as chemical vapor deposition, and may be formed such that outer edges of the sidewall spacers 510 taper near the topmost surface of the film stack 306.

Figure 4:
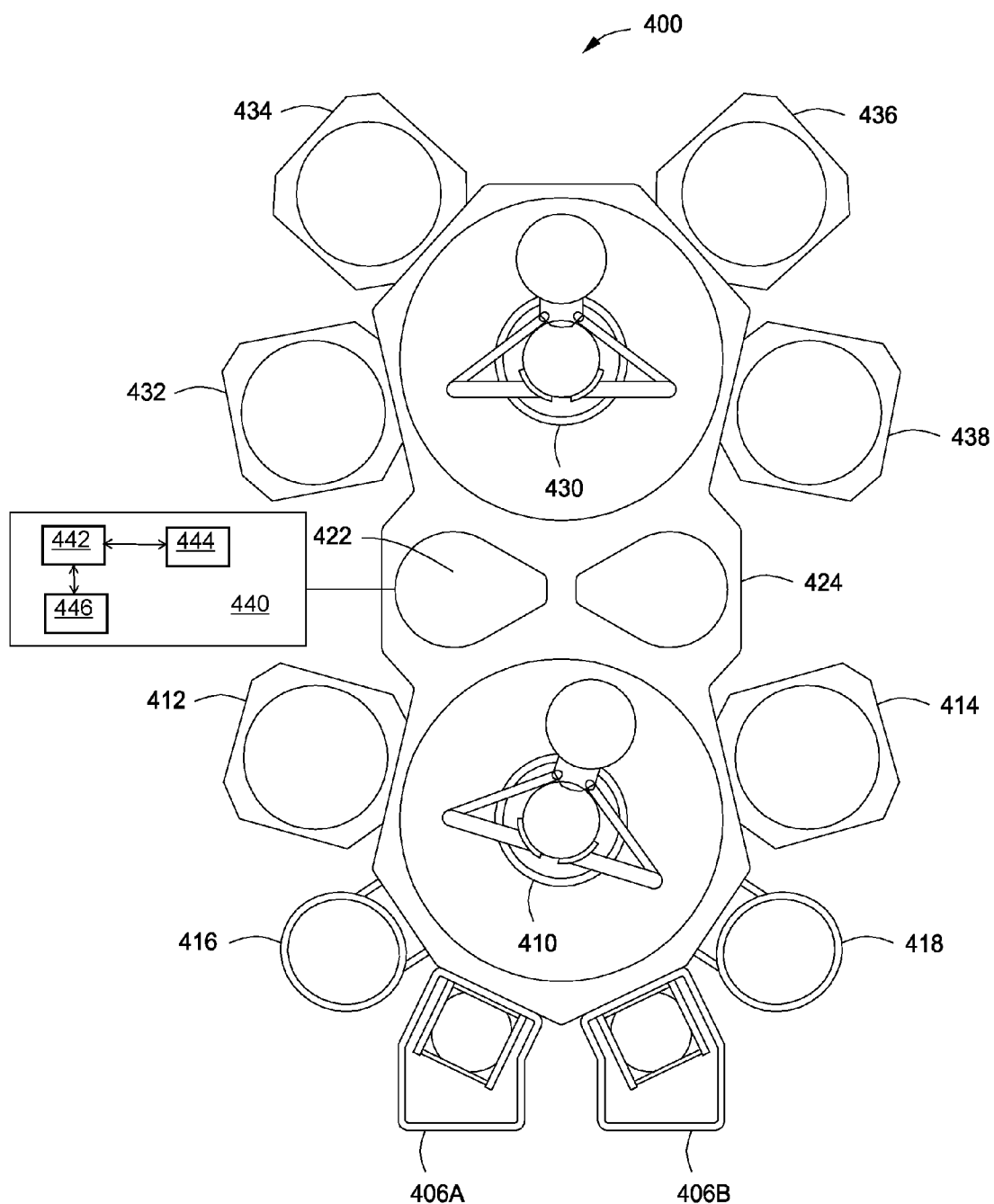
FIG. 4 depicts a cluster tool suitable to perform methods for processing a semiconductor device having a multi-threshold voltage structure in accordance with some embodiments of the present disclosure.
Figure 5:
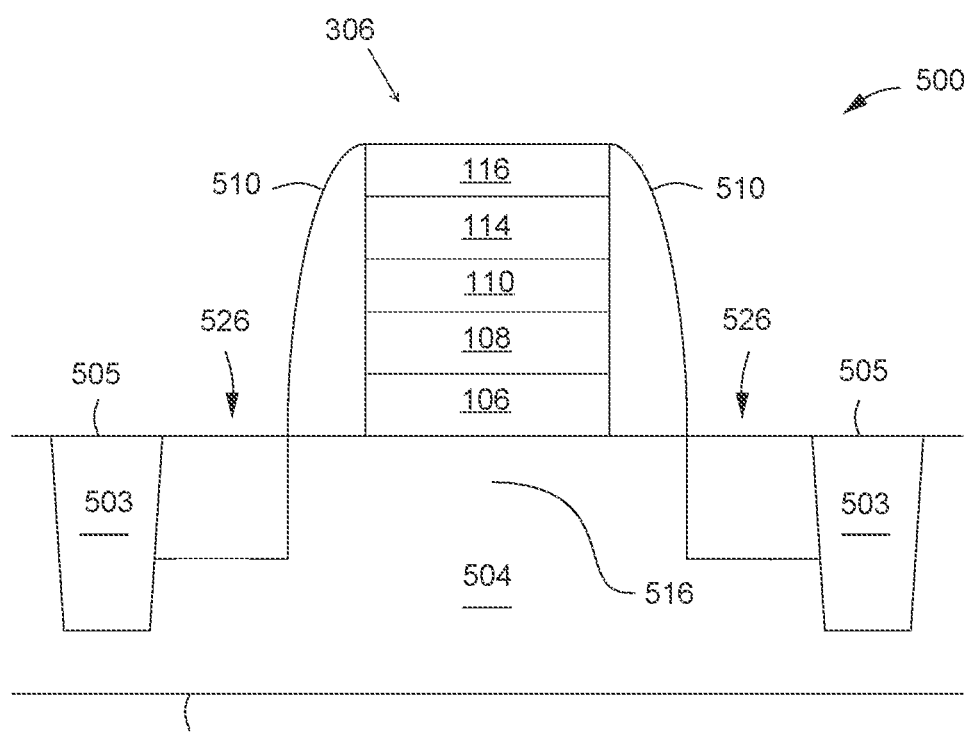
FIG. 5 depicts an exemplary semiconductor device having a multi-threshold voltage structure in accordance with some embodiments of the present disclosure.

The method 200 described herein may be performed in individual process chambers that may be provided in a standalone configuration or as part of one or more cluster tools, for example, an integrated tool 400 (i.e., cluster tool) described with respect to FIG. 4. Examples of the integrated tool 400 include the CENTURA® and ENDURA® integrated tools, available from Applied Materials, Inc., of Santa Clara, Calif. However, the methods described herein may be practiced using other cluster tools having suitable process chambers coupled thereto, or in other suitable process chambers. For example, in some embodiments the inventive methods discussed above may advantageously be performed in an integrated tool such that there are limited or no vacuum breaks between processing steps.

The integrated tool 400 can include one or more load lock chambers 406A, 406B for transferring of substrates into and out of the integrated tool 400. Typically, since the integrated tool 400 is under vacuum, the load lock chambers 406A, 406B may "pump down" the substrates introduced into the integrated tool 400. A first robot 410 may transfer the substrates between the load lock chambers 406A, 406B, and a first set of one or more substrate processing chambers 412, 414, 416, 418 (four are shown). Each substrate processing chamber 412, 414, 416, 418, can be outfitted to perform a number of substrate processing operations including the method 200 described above in addition to, physical vapor deposition processes (PVD), atomic layer deposition (ALD), chemical vapor deposition (CVD), pre-clean, thermal process/degas, orientation and other substrate processes.

The first robot 410 can also transfer substrates to/from one or more intermediate transfer chambers 422, 424. The intermediate transfer chambers 422, 424 can be used to maintain ultrahigh vacuum conditions while allowing substrates to be transferred within the integrated tool 400. A second robot 430 can transfer the substrates between the intermediate transfer chambers 422, 424 and a second set of one or more substrate processing chambers 432, 434, 436, 438. Similar to substrate processing chambers 412, 414, 416, 418, the substrate processing chambers 432, 434, 436, 438 can be outfitted to perform a variety of substrate processing operations including the physical vapor deposition processes described herein in addition to atomic layer deposition (ALD), chemical vapor deposition (CVD), pre-clean, thermal process/degas, and orientation, for example. Any of the substrate processing chambers 412, 414, 416, 418, 432, 434, 436, 438 may be removed from the integrated tool 400 if not necessary for a particular process to be performed by the integrated tool 400.

A controller 440 may be provided and coupled to various components of the integrated tool 400 to control the operation of the integrated tool 400. The controller 440 includes a central processing unit (CPU) 442, a memory 444, and support circuits 446. The controller 440 may control the integrated tool 400 directly, or via computers (or controllers) associated with particular process chambers and/or support system components. The controller 440 may be any form of general-purpose computer processor that can be used in an industrial setting for controlling various chambers and sub-processors. The memory 444, or computer readable medium, of the controller 440 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 446 are coupled to the CPU 442 for supporting the processor in a conventional manner. Support circuits 446 typically include cache, power supplies, clock circuits, input/output circuitry and subsystems, and the like. Inventive methods as described herein may be stored in the memory 444 as software routine that may be executed or invoked to control the operation of the integrated tool 400 in the manner described herein. The software routine may also be stored and/or executed by a second CPU (not shown) that is remotely located from the hardware being controlled by the CPU 442.

While the foregoing is directed to embodiments of the present disclosure, other and further embodiments of the disclosure may be devised without departing from the basic scope thereof.

The invention claimed is:

1. A semiconductor device having a multi-threshold voltage structure, comprising:
   a substrate;
   a gate dielectric layer atop the substrate, wherein the gate dielectric layer comprises an interface layer and a high-k dielectric layer atop the interface layer;
   a lanthanum nitride layer deposited atop the high-k dielectric layer;
   an interface of the interface layer and the high-k dielectric layer comprising lanthanum species from the lanthanum nitride layer; and
   a gate electrode layer atop the lanthanum nitride layer.

2. The semiconductor device of claim 1, wherein the lanthanum nitride layer has a thickness of about 3 angstroms.

3. The semiconductor device of claim 1, wherein the lanthanum nitride layer is about 10 to about 50 atomic percent nitrogen and the balance lanthanum.

4. The semiconductor device of claim 1, wherein the high-k dielectric layer is hafnium oxide or hafnium silicate.

5. The semiconductor device of claim 1, wherein the gate electrode layer is titanium nitride.

6. A method of forming a semiconductor device having a multi-threshold voltage structure, comprising:
   depositing a lanthanum nitride layer atop a substrate comprising a gate dielectric layer, wherein the gate dielectric layer comprises an interface layer and a high-k dielectric layer atop the interface layer;
   depositing a gate electrode layer atop the lanthanum nitride layer;
   depositing a capping layer atop the gate electrode layer; and
   annealing the substrate to a temperature of about 700 to about 950 degrees Celsius to diffuse lanthanum species from the lanthanum nitride layer to an interface of the interface layer and the high-k dielectric layer.

7. The method of claim 6, further comprising:
   patterning the semiconductor device to form a film stack atop the substrate; and
   forming a source/drain region atop the substrate.

8. The method of claim 6, wherein the lanthanum nitride layer has a thickness of about 3 angstroms.

9. The method of claim 6, wherein the lanthanum nitride layer is about 10 to about 50 atomic percent nitrogen and the balance lanthanum.

10. The method of claim 6, wherein the high-k dielectric layer is hafnium oxide or hafnium silicate.

11. The method of claim 6, wherein the gate electrode layer is titanium nitride.

12. The method of claim 6, wherein the lanthanum nitride layer is deposited via an atomic layer deposition process.

13. The semiconductor device of claim 1, further comprising a capping layer deposited atop the gate electrode layer for protecting the gate electrode layer from processing.

14. The semiconductor device of claim 13, wherein the capping layer is polysilicon.

15. The semiconductor device of claim 1, wherein the high-k dielectric layer comprises a dielectric material having a dielectric constant greater than about 4.

16. The semiconductor device of claim 1, wherein the substrate comprises a p-type region, and wherein the gate dielectric layer is disposed atop at least part of the p-type region.

17. The semiconductor device of claim 16, wherein the p-type region has a doping density of between about $5\times10^{16}$ atoms/cm$^3$ and about $5\times10^{19}$ atoms/cm$^3$.

18. The semiconductor device of claim 16, wherein the substrate further comprises first and second source/drain regions, the first source/drain region disposed on a first side of the gate dielectric layer and the second source/drain region disposed on a second side of the gate dielectric layer.

19. The semiconductor device of claim 16, further comprising first and second sidewall spacers comprising insulating material, wherein the first sidewall spacer is formed along a first outer sidewall of a film stack comprising the gate dielectric layer, the lanthanum nitride layer, the interface layer, and the gate electrode layer, and wherein the second sidewall spacer is formed along a second outer sidewall of the film stack.

20. A non-transitory computer readable medium, having instructions stored thereon that, when executed, cause a method of forming a semiconductor device having a multi-threshold voltage structure, the method comprising:
   depositing a lanthanum nitride layer atop a substrate comprising a gate dielectric layer, wherein the gate dielectric layer comprises an interface layer and a high-k dielectric layer atop the interface layer;
   depositing a gate electrode layer atop the lanthanum nitride layer;
   depositing a capping layer atop the gate electrode layer; and
   annealing the substrate to a temperature of about 700 to about 950 degrees Celsius to diffuse lanthanum species from the lanthanum nitride layer to an interface of the interface layer and the high-k dielectric layer.

* * * * *